US007242331B1

(12) United States Patent
Lin

(10) Patent No.: US 7,242,331 B1
(45) Date of Patent: Jul. 10, 2007

(54) ERROR AVERAGING COMPARATOR BASED SWITCH CAPACITOR CIRCUIT AND METHOD THEREOF

(75) Inventor: Chia-Liang Lin, Union City, CA (US)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/277,942

(22) Filed: Mar. 29, 2006

(51) Int. Cl.
H03M 1/06 (2006.01)
(52) U.S. Cl. .................... 341/118; 341/150; 341/155; 341/161; 341/172; 327/157
(58) Field of Classification Search .............. None
See application file for complete search history.

(56) References Cited

U.S. PATENT DOCUMENTS

| 5,475,326 | A  | * | 12/1995 | Masuda ............... 327/157 |
| 5,929,677 | A  | * | 7/1999  | Murata ............... 327/157 |
| 6,157,322 | A  | * | 12/2000 | Anderson ............. 340/903 |
| 6,271,784 | B1 | * | 8/2001  | Lynn et al. ........... 341/150 |
| 6,922,097 | B2 | * | 7/2005  | Chan et al. ........... 327/536 |
| 7,023,250 | B2 | * | 4/2006  | Chen ................. 327/157 |
| 2006/0208938 | A1 | * | 9/2006 | Fiorenza et al. ....... 341/172 |
| 2007/0035335 | A1 | * | 2/2007 | Lee .................. 327/94 |

OTHER PUBLICATIONS

Fiorenza, John K. et al. "Comparator-Based Switched-Capacitor Circuits for Scaled CMOS technologies", IEEE Journal of Solid-State Circuits. vol. 41, No. 12, Dec. 2006, pp. 2658-2668.*
Todd Sepke et al, "Comparator-Based Switched-Capacitor Circuits For Sealed CMOS Technologies", ISSCC 2006 / Session 12 / NYQUIST ADCs / 12.4, Feb. 7, 2006, pp. 220-221, pp. 649, 2006 IEEE International Solid-State Circuits Conference.

* cited by examiner

Primary Examiner—Khai M. Nguyen
(74) Attorney, Agent, or Firm—Winston Hsu

(57) ABSTRACT

An error averaging comparator based switch capacitor (CBSC) circuit cyclically operates through a sampling phase, a first transfer phase, and a second transfer phase. During the sampling phase, an input voltage is sampled. During the first transfer phase, the sampled input voltage is amplified by a fixed ratio and transferred to a first load. During the second transfer phase, the sampled input voltage is amplified by the same fixed ratio and transferred to a second load. The circuit configuration during the second transfer phase is substantially the same as that during the first transfer phase, except that the at least one of its circuit elements is connected in a reverse polarity. Due to the reverse polarity, the respective errors due to circuit non-idealities during the two transfer phases are exactly opposite. By combining the outputs taken at the first load and at the second load, the errors are averaged out.

20 Claims, 5 Drawing Sheets

ERROR AVERAGING COMPARATOR BASED SWITCH CAPACITOR CIRCUIT AND METHOD THEREOF

CROSS-REFERENCE TO RELATED APPLICATIONS

This application is related to the following copending applications, owned by the assignee of this invention:
1) Lin, Ser. No. 11/277,939, for "ERROR CANCELLING COMPARATOR BASED SWITCH CAPACITOR CIRCUIT AND METHOD THEREOF".
2) Lin, Ser. No. 11/278,432, for "NOISE SHAPING COMPARATOR BASED SWITCH CAPACITOR CIRCUIT AND METHOD THEREOF"

BACKGROUND OF THE INVENTION

1. Field of the Invention

The present invention relates to comparator based switch capacitor circuit, in particular to comparator based switch capacitor circuit that performs circuit error averaging.

2. Description of Related Art

Comparator based switch capacitor (CBSC) circuit is an emerging technology that offers many advantages over conventional operational amplifier based switch capacitor circuit. Like a conventional switch capacitor circuit, a CBSC circuit also works in a two-phase manner. The two phases are "sampling" phase and "transfer" phase, controlled by two non-overlapping clocks, say $\phi_1$ and $\phi_2$, respectively. In a typical two-phase CBSC circuit working at a sampling rate off, the duration of each phase is slightly less than half of the sampling clock period T=1/f During sampling phase ($\phi_1$), an input voltage $V_I$ is sampled using a sampling capacitor $C_1$ by connecting the "+" end of $C_1$ to $V_I$ and the "−" end to a common mode voltage $V_{CM}$. During transfer phase ($\phi_2$), the charge stored on the sampling capacitor $C_1$ is transferred to an integrating capacitor $C_2$ via a charge transfer circuit comprising a comparator 130 and a charge pump (CP) 140, which includes a current source $I_1$ and a current sink $I_2$, as shown in FIG. 1. In FIG. 2, $C_L$ is a load capacitor for the CBSC circuit 100, $V_{DD}$ is a supply voltage, $V_{SS}$ is the lowest potential in the system. Note that $V_{CM}$ is the common mode voltage that is usually close to the mean value of $V_{DD}$ and $V_{SS}$. Also, $C_L$ is terminated to $V_{CM}$ via a sampling switch 150, which is controlled by a switch signal S. The purpose of the charge transfer circuit is to transfer the charge stored on $C_1$ to $C_2$ until the potentials on its two ends are equal, i.e. $V_X = V_{CM}$. The principle of the CBSC circuit 100 during transfer phase ($\phi_2$) is briefly described as follows.

At the beginning of the charge transfer phase, a brief preset (P) must be performed to clear $C_L$ and ensure the voltage $V_X$ is below $V_{CM}$. The preset is done by momentarily pulling the output node $V_O$ to $V_{SS}$, the lowest potential in the system. Next, a coarse charge transfer phase ($E_1$) begins. During coarse charge transfer phase, $V_X < V_{CM}$ and CP 140 turns on the current source $I_1$ to inject charge into the circuit comprising $C_L$, $C_2$, and $C_1$, resulting in a relatively fast voltage ramp on $V_X$ toward $V_{CM}$. CP 140 continues to inject charge until comparator 130 detects $V_X > V_{CM}$. At the instant where comparator 130 detects $V_X > V_{CM}$, a fine charge transfer phase ($E_2$) commences by turning off the current source $I_1$ and turning on the current sink $I_2$ to drain charge from the circuit comprising $C_L$, $C_1$, and $C_2$. One deliberately chooses $I_2$ to be lower than $I_1$ resulting in a relatively slow voltage ramp down on $V_X$ back toward $V_{CM}$. At the instant where the comparator 130 detects $V_X < V_{CM}$ again, the sampling switch 150 is opened and the charge stored on $C_L$ is sampled and frozen.

FIG. 2 depicts a typical timing diagram for the CBSC circuit 100 for the charge transfer phase. Initially the switch signal S is asserted. As a result, the sampling switch 150 is closed and the load $C_L$ is terminated to $V_{CM}$. In the mean while, $V_O$ stays at the sampled level from the previous cycle and $V_X$ is close to $V_{CM}$. The transfer phase $\phi_2$, starting at time $t_1$ and ending at time $t_5$, comprises four sub-phases: preset (P), coarse charge transfer ($E_1$), fine charge transfer ($E_2$), and hold (H). The CBSC circuit 100 first enters the P phase (at time $t_1$), where it pulls the output node $V_O$ to $V_{SS}$ and causes $V_X$ to drop to $V_{XO}$, which is below $V_{CM}$. At time $t_2$, it enters the $E_1$ phase, where comparator detects $V_X < V_{CM}$ and CP 140 injects charge into the circuit comprising $C_L$, $C_2$, and $C_1$, resulting in relatively fast voltage ramp up on both $V_O$ and $V_X$. The $E_2$ phase starts at time $t_3$, the instant where comparator 130 detects $V_X > V_{CM}$. Note that due to circuit delay, $t_3$ slightly trails the exact time instant where $V_X$ rises past $V_{CM}$. During the $E_2$ phase, CP 140 drains charge from the circuit comprising $C_L$, $C_2$, and $C_1$, resulting in a relatively slow voltage ramp down on both $V_O$ and $V_X$. Finally, the CBSC circuit 100 enters the H phase at time $t_4$, where comparator 130 detects $V_X < V_{CM}$ again. Again, due to circuit delay, $t_4$ slightly trails the exact time instant where $V_X$ falls past $V_{CM}$. During the H phase, S is de-asserted and thus the charge stored on CL is frozen, and also charge pump circuit CP 140 is disabled.

There are two problems associated with the prior art CBSC circuit 100. First, there is always an error on the final sampled value of $V_O$ due to the circuit delay. As clearly seen in FIG. 2, the actual sampled value is always slightly lower than the ideal sample value, which is the value at the exact time instant where $V_X$ falls past $V_{CM}$. Second, the prior art CBSC circuit 100 is subject to error due to the offset in the comparator 130.

What is needed is a method to remove the errors due to circuit non-idealities, in particular circuit delay and comparator offset, for CBSC circuit.

BRIEF SUMMARY OF THIS INVENTION

In an embodiment, a comparator based switch capacitor (CBSC) circuit is disclosed. The CBSC circuit comprises a comparator, a charge pump, and a plurality of capacitors. The CBSC circuit operates cyclically through a sampling phase, a first transfer phase, and a second transfer phase. During the sampling phase the CBSC circuit samples an input voltage; during the first transfer phase the CBSC circuit amplifies the sampled input voltage by a ratio and transfers a first resultant voltage to a first load; and during the second transfer phase the CBSC circuit reverses a polarity of connection for at least one of its circuit elements, amplifies the sampled input voltage by the ratio, and transfers a second resultant voltage to a second load. Due to the reverse polarity, the respective errors due to circuit non-idealities during the two transfer phases are exactly opposite. By combining the outputs taken at the first load and at the second load, the errors are averaged out.

In an embodiment, a method of averaging out the error due to circuit non-idealities for a comparator based switch capacitor (CBSC) circuit is disclosed. The CBSC circuit comprises a comparator, a charge pump, and a plurality of capacitors. The method comprises: operating cyclically through a sampling phase, a first transfer phase, and a second transfer phase. During the sampling phase the CBSC circuit samples an input voltage; during the first transfer phase the CBSC circuit amplifies the sampled input voltage by a ratio and transfers a first resultant voltage to a first load; and during the second transfer phase the CBSC circuit reverses a polarity of connection for at least one of its circuit elements, amplifies the sampled input voltage by the ratio, and transfers a second resultant voltage to a second load. Due to the reverse polarity, the respective errors due to circuit non-idealities during the two transfer phases are exactly opposite. By combining the outputs taken at the first load and at the second load, the errors are averaged out.

BRIEF DESCRIPTION OF THE DRAWINGS

The subject matter regarded as the invention is particularly pointed out and distinctly claimed in the concluding portion of the specification. The invention, both as to device and method of operation, together with features and advantages thereof may best be understood by reference to the following detailed description with the accompanying drawings in which:

DETAILED DESCRIPTION OF THIS INVENTION

The present invention relates to error averaging for comparator based switch capacitor (CBSC) circuit. While the specifications describe several example embodiments of the invention considered best modes of practicing the invention, it should be understood that the invention can be implemented in many ways and is not limited to the particular examples described below or to the particular manner in which any features of such examples are implemented.

The present invention is general and applicable to any sampled-data analog circuit. For example, the present invention can be applied to a pipeline ADC (analog-digital converter), and also to a delta-sigma ADC (analog-digital converter). A sampled-data analog circuit usually works in a multi-phase manner. By way of example but not limitation, a two-phase switch-capacitor circuit in accordance with the present invention is disclosed. Like the prior art described earlier, the two phases are sampling phase ($\phi_1$) and transfer phase ($\phi_2$).

The present invention discloses a method to remove the error due to comparator offset and circuit delay in the prior art CBSC circuit 100 by performing error averaging. In a preferred embodiment, the sampling capacitor $C_1$ is now implemented by two capacitors $C_{1A}$ and $C_{1B}$ of the same capacitance value. During the sampling phase ($\phi_1$), the "+" ends of both $C_{1A}$ and $C_{1B}$ are connected to the input voltage $V_I$, while the "−" ends of both $C_{1A}$ and $C_{1B}$ are connected to the common mode voltage $V_{CM}$. Also, the load capacitor $C_L$ is now implemented by two capacitors $C_{LA}$ and $C_{LB}$, of the same capacitance value.

Figure 1:
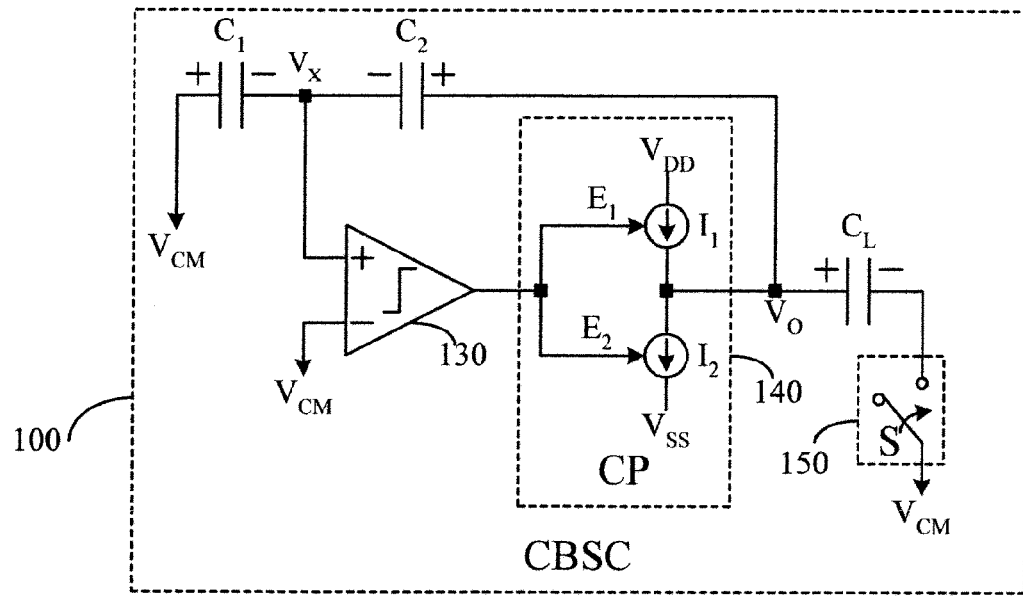
FIG. 1 depicts a prior art comparator based switch capacitor (CBSC) circuit during transfer phase.
Figure 3:
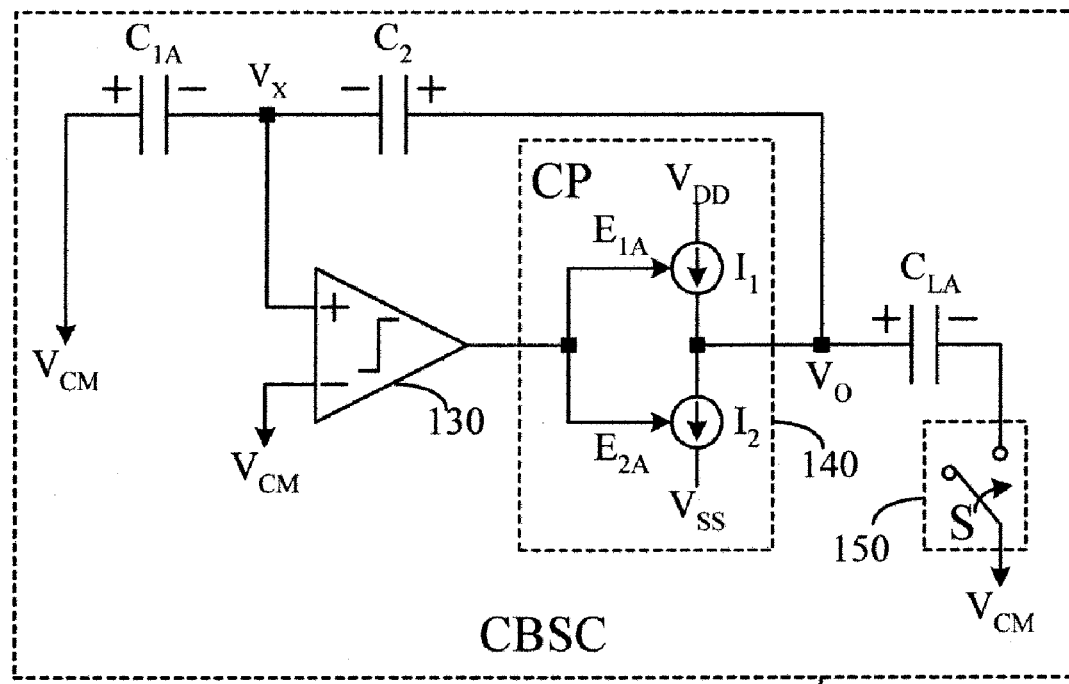
FIG. 3 depicts an embodiment of CBSC circuit during a first transfer phase in accordance with the present invention.

In a preferred embodiment, the transfer phase ($\phi_2$) is further divided into two non-overlapping phases: a first transfer phase ($\phi_{2A}$) and a second transfer phase ($\phi_{2B}$). The circuit configuration during the first transfer phase ($\phi_{2A}$) is depicted in FIG. 3. Here, one uses a CBSC circuit 100A that is exactly the same as the prior art CBSC 100 circuit shown in FIG. 1 except for the following changes: (1) $C_1$ is replaced by $C_{1A}$ (2) $C_L$ is replaced by $C_{LA}$, (3) $E_1$ is replaced by $E_{1A}$, and (4) $E_2$ is replaced by $E_{2A}$. CBSC 100A has essentially the same configuration as CBSC 100, and also works in exactly the same manner. That is, we first performs a preset ($P_A$) to force $V_X < V_{CM}$, then perform a coarse transfer ($E_{1A}$) until $V_X > V_{CM}$ is detected, then perform a fine transfer ($E_{2A}$) until $V_X < V_{CM}$ is detected again, finally hold ($H_A$) the charges on all capacitors. At the end of the first transfer phase ($\phi_{2A}$), the charge stored on load $C_{LA}$ contains an error due to comparator offset and circuit delay.

Figure 4:
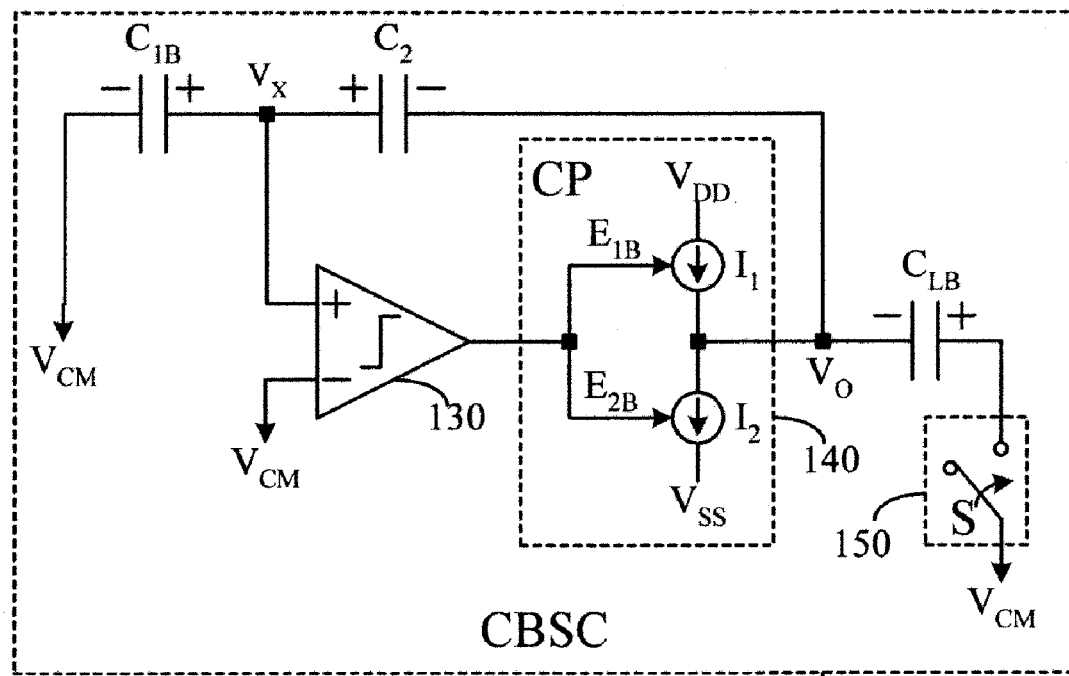
FIG. 4 depicts an embodiment of CBSC circuit during a second transfer phase in accordance with the present invention.

The circuit configuration during the second transfer phase ($\phi_{2B}$) is depicted in FIG. 4. Here, one uses a CBSC circuit 100B that is exactly the same as CBSC 100A circuit shown in FIG. 3 except for the following changes: (1) $C_{1A}$ is replaced by $C_{1B}$ connected in a reverse polarity (2) $C_{LA}$ is replaced by $C_{LB}$ connected in a reverse polarity, (3) $C_2$ is connected in a reverse polarity, (4) $E_{1A}$ is replaced by $E_{1B}$, and (5) $E_{2A}$ is replaced by $E_{2B}$. CBSC 100B has substantially the same configuration as CBSC 100A, and also works in exactly the same manner. That is, we first performs a preset ($P_B$) to force $V_X < V_{CM}$, then perform a coarse transfer ($E_{1B}$) until $V_X > V_{CM}$ is detected, then perform a fine transfer ($E_{2B}$) until $V_X < V_{CM}$ is detected again, finally hold ($H_B$) the charges on all capacitors. At the end of the second transfer phase ($\phi_{2A}$), the charge stored on load $C_{LB}$ contains an error due to comparator offset and circuit delay. Due to the connections in a reverse polarity, the error stored on $C_{LA}$ at the end of the first transfer phase is exactly opposite to the error stored on $C_{LB}$ at the end of the second transfer phase.

The two opposite errors can be averaged out explicitly or implicitly. In an embodiment, the two load capacitors $C_{LA}$ and $C_{LB}$ are connected in parallel (by connecting the "+" end of $C_{LA}$ with the "+" end of $C_{LB}$ and connecting the "−" end of $C_{LA}$ with the "−" end of $C_{LB}$) following the end of the second transfer phase ($\phi_{2B}$). In that scenario, the errors are averaged out explicitly. In an embodiment, $C_{LA}$ and $C_{LB}$ form a pair of sampling capacitors (just like $C_{1A}$ and $C_{1B}$) for some part of the system (for example, for the next pipeline stage in a pipeline ADC). In that case, the errors can be averaged out implicitly, as the voltages stored on $C_{1A}$ and $C_{1B}$ can be processed separately, as shown in FIG. 3 and FIG. 4.

Figure 2:
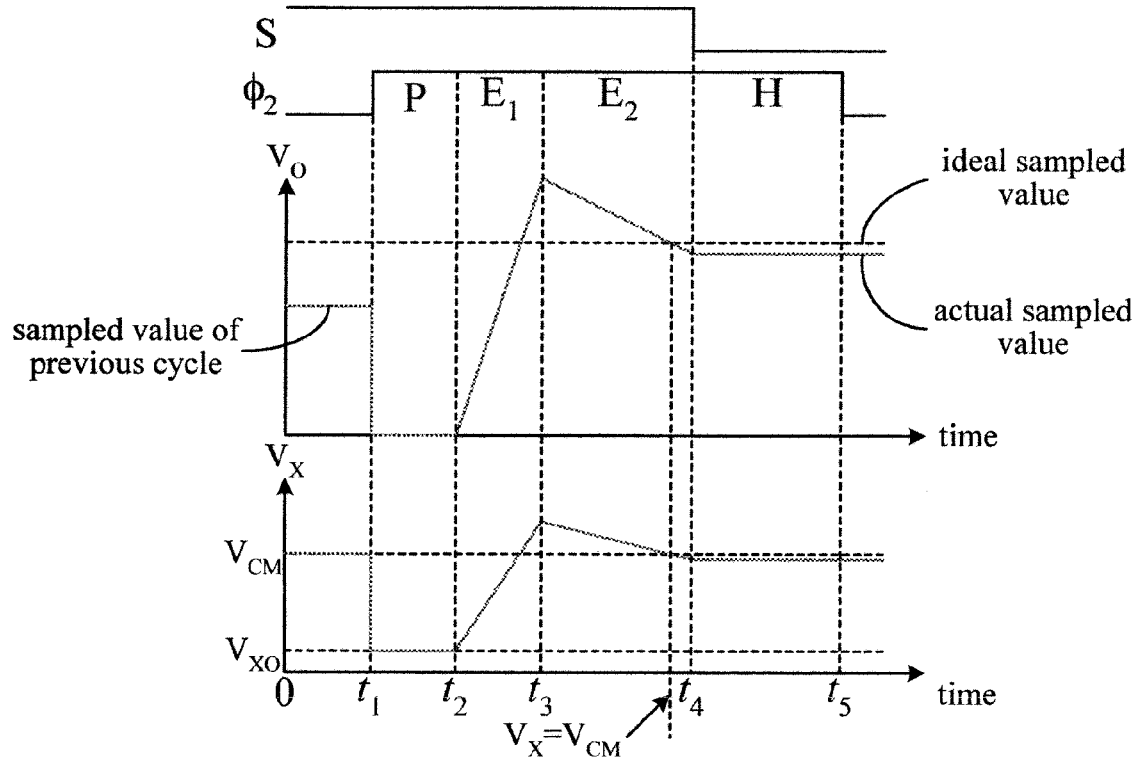
FIG. 2 depicts a typical timing diagram for the CBSC circuit depicted in FIG. 1.
Figure 5:
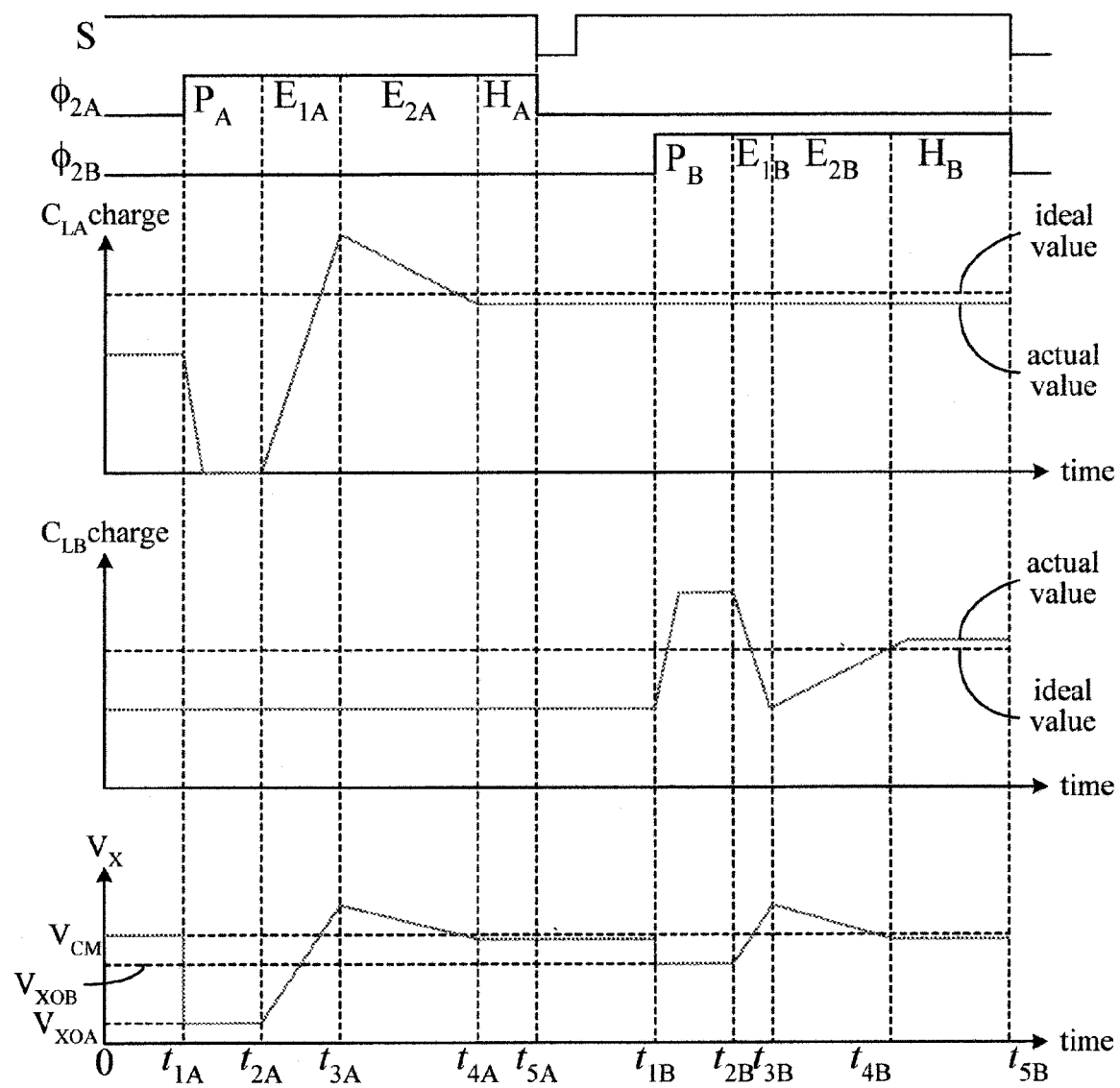
FIG. 5 depicts a typical timing diagram for a CBSC during the first transfer phase illustrated by FIG. 3, and also the second transfer phase illustrated by FIG. 4.

An illustrative timing diagram for the complete transfer phase is shown in FIG. 5. During the first transfer phase ($\phi_{2A}$), the waveform of $V_X$ is very similar to that in FIG. 2. Due to circuit non-idealities, the final charge stored on $C_{LA}$ is slightly below the ideal value. During the second transfer phase ($\phi_{2B}$), the waveform of $V_X$ is very similar to that during the first transfer phase ($\phi_{2A}$), except that $V_X$ is pulled to a different value ($V_{XOB}$ instead of $V_{XOA}$) during preset ($P_B$). The waveform of the charge stored on $C_{LB}$ during the second transfer phase ($\phi_{2B}$), however, is quite different from the waveform of the charge stored on $C_{LA}$ during the first transfer phase ($\phi_{2A}$), thanks to the polarity inversion. First, the charge on $C_{LB}$ is pulled high during preset ($P_B$). Then, the charge on $C_{LB}$ ramps down during coarse transfer $E_{1B}$ at a rate that is substantially identical to the rate of the ramp up of the charge on $C_{LA}$ during coarse transfer $E_{1A}$. Then, the charge on $C_{LB}$ ramps up during fine transfer $E_{2B}$ at a rate that is substantially identical to the rate of the ramp down of the charge on $C_{LA}$ during fine transfer $E_{2A}$. Due to circuit non-idealities, the final charge stored on $C_{LB}$ is slightly above the ideal value. Since the circuit configuration in the first transfer phase is substantially the same as that in the second transfer phase except for the polarity of connection, the errors due to circuit non-idealities are substantially of the same magnitude but of opposite signs. The errors can thus be averaged out by, for example, connecting $C_{LA}$ and $C_{LB}$ in parallel.

In a nutshell, reversing a polarity of connection for capacitors involved in charge transfer reverses the error due to circuit delay and comparator offset. In practice, the error due to comparator offset is usually much smaller than the error due to circuit delay. In the example shown in FIG. 5, the effect of comparator offset is deemed negligible (compared to the error due to circuit delay) and thus not noticeable.

For those of ordinary skill in the art, the principle disclosed by the present invention can be practiced in various alternative forms, including the following:

1. In an embodiment, one may pull the output voltage $V_O$ to $V_{DD}$, the highest potential of the system, during the preset ($P_A$ or $P_B$) phase, thus forcing the condition $V_x > V_{CM}$ before entering the coarse transfer phase ($E_{1A}$ or $E_{1B}$). In that scenario, $I_1$ needs to be changed to a current sink while $I_2$ needs to be changed to a current source.

2. In an embodiment, one may totally eliminate the fine transfer phases $E_{2A}$ and $E_{2B}$, as the error due to circuit delay can be completely averaged out and therefore there is no need to use a fine transfer to reduce the error caused by circuit delay. In this case, the $I_2$ current is eliminated, and the overall operation speed of the switch capacitor circuit improves.

3. In an embodiment, during any of the two transfer phases ($\phi_{2A}$ and $\phi_{2B}$), the "+" end of capacitor $C_{1A}$ in FIG. 3 or the "+" end of capacitor $C_{1B}$ in FIG. 4 may be connected to a voltage different from $V_{CM}$. For example, for a pipeline ADC application, the "+" end of either capacitor may be connected to one of many other predefined voltages depending on the range of the voltage $V_I$. The principle taught by the present invention, however, applies equally well to that scenario.

4. In a further embodiment, the capacitor $C_{1A}$ ($C_{1B}$) is implemented using a plurality of capacitors, which are connected in parallel during the sampling phase ($\phi_1$) but during the transfer phase $\phi_{2A}$ ($\phi_{2B}$) their "+" ("−") ends may be connected to different voltages, each chosen from either among many predefined voltages or connected to an internal node within the system. The principle taught by the present invention, however, applies equally well to that scenario.

Figure 6:
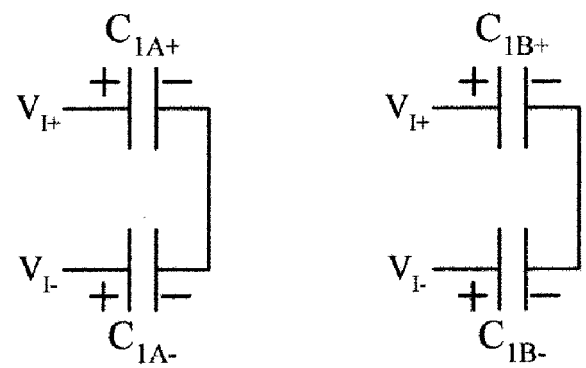
FIG. 6 depicts a differential circuit embodiment during a sampling phase.
Figure 7:
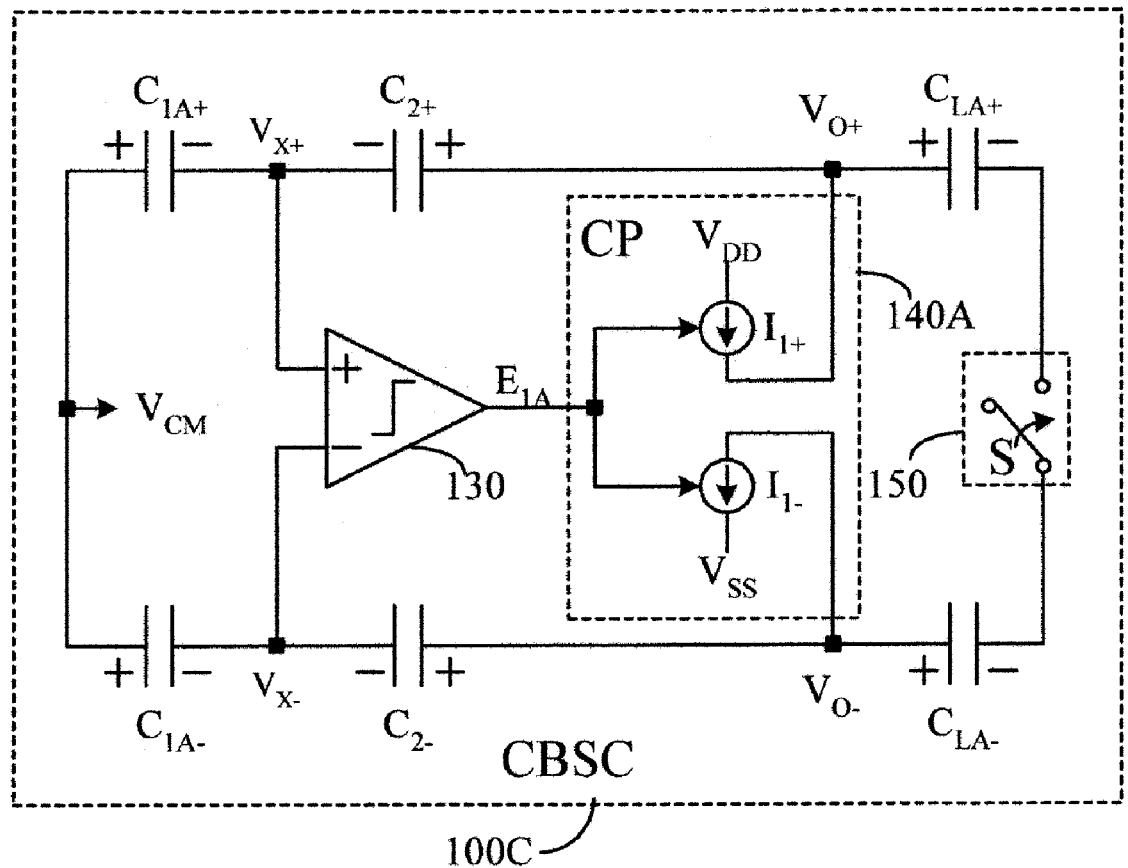
FIG. 7 depicts a differential circuit embodiment during a first transfer phase.
Figure 8:
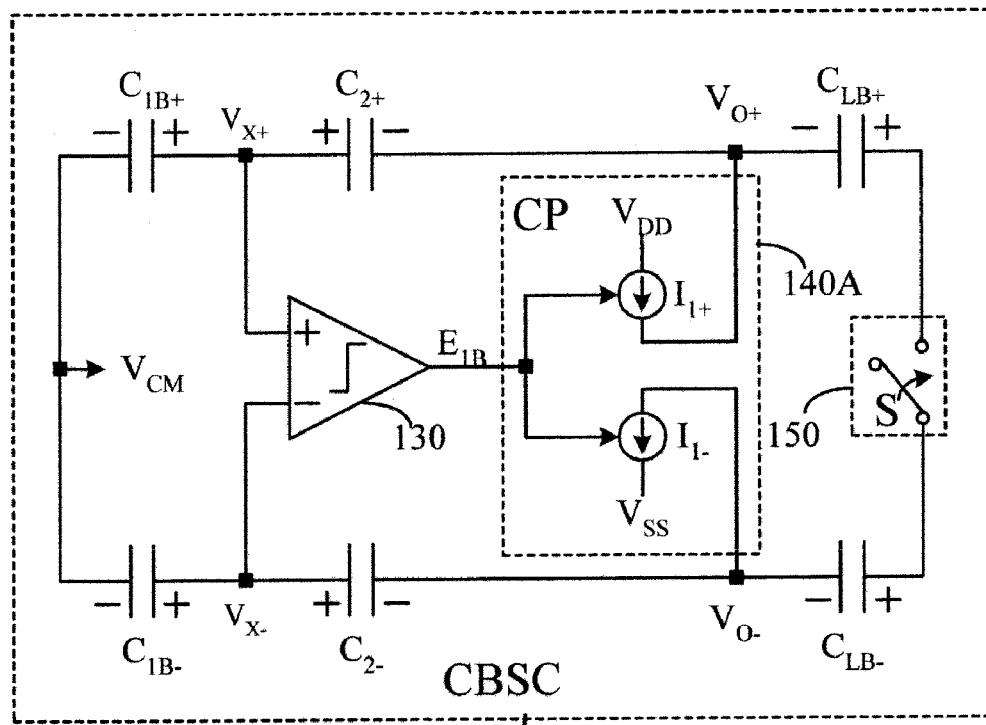
FIG. 8 depicts a differential circuit embodiment during a second transfer phase.

In an embodiment, one may also use a differential circuit instead of a single-ended circuit. FIG. 6 depicts an embodiment of a differential circuit during the sampling phase, where two pairs of sampling capacitors $C_{1A+}/C_{1A-}$ and $C_{1B+}/C_{1B-}$ sample a differential input voltage $V_{I+}/V_{I-}$. FIG. 7 depicts an embodiment of a differential circuit CBSC 100C during the first transfer phase, where the charges stored on $C_{1A+}/C_{1A-}$ are transferred to a pair of integrating capacitors $C_{2+}/C_{2-}$ using the differential charge pump circuit CP 140A. The first transfer phase comprises three sub-phases: preset ($P_A$), coarse charge transfer ($E_{1A}$) and hold ($H_A$). Although a fine transfer phase $E_{2A}$ is not included here, those of ordinary skill in the art may include a fine transfer phase by adding a current source $I_{2+}$ and a current sink $I_2$ that are both controlled by $E_{2A}$. During preset ($P_A$), $V_{O+}$ is pulled to $V_{SS}$ and $V_{O-}$ is pulled to $V_{DD}$, forcing $V_{X+} < V_{X-}$. During coarse charge transfer ($E_{1A}$), $V_{X+} < V_{X-}$ and CP 140A injects charge into $V_{O+}$ and drains charge from $V_{O-}$ until comparator 130 detects $V_{X+} > V_{X-}$. Then it enters hold ($H_A$) phase, where switch 150 is turned off and CP 140A is disabled. In one embodiment, the circuit configuration of CBSC 100D during the second transfer phase is depicted in FIG. 8, which is exactly the same as CBSC 100C depicted in FIG. 7 except for the following changes: (1) $C_{1A+}/C_{1A-}$ are replaced by $C_{1B+}/C_{1B-}$ connected in a reverse polarity, (2) $C_{LA+}/C_{LA-}$ are replaced by $C_{LB+}/C_{LB-}$ connected in a reverse polarity, (3) $C_{2+}/C_{2-}$ are connected in a reverse polarity, and (4) $E_{1A}$ is replaced by $E_{1B}$. Similarly, the second transfer phase comprises three sub-phases: preset ($P_B$), coarse charge transfer ($E_{1B}$) and hold ($H_B$). During preset ($P_B$), $V_{O+}$ is pulled to $V_{SS}$ and $V_{O-}$ is pulled to $V_{DD}$, forcing $V_{X+} < V_{X-}$. During coarse charge transfer ($E_{1B}$), $V_{X+} < V_{X-}$ and CP 140A injects charge into $V_{O+}$ and drains charge from $V_{O-}$ until comparator 130 detects $V_{X+} + > V_{X-}$. Then it enters hold ($H_B$) phase, where switch 150 is turned off and CP 140A is disabled.

Figure 9:
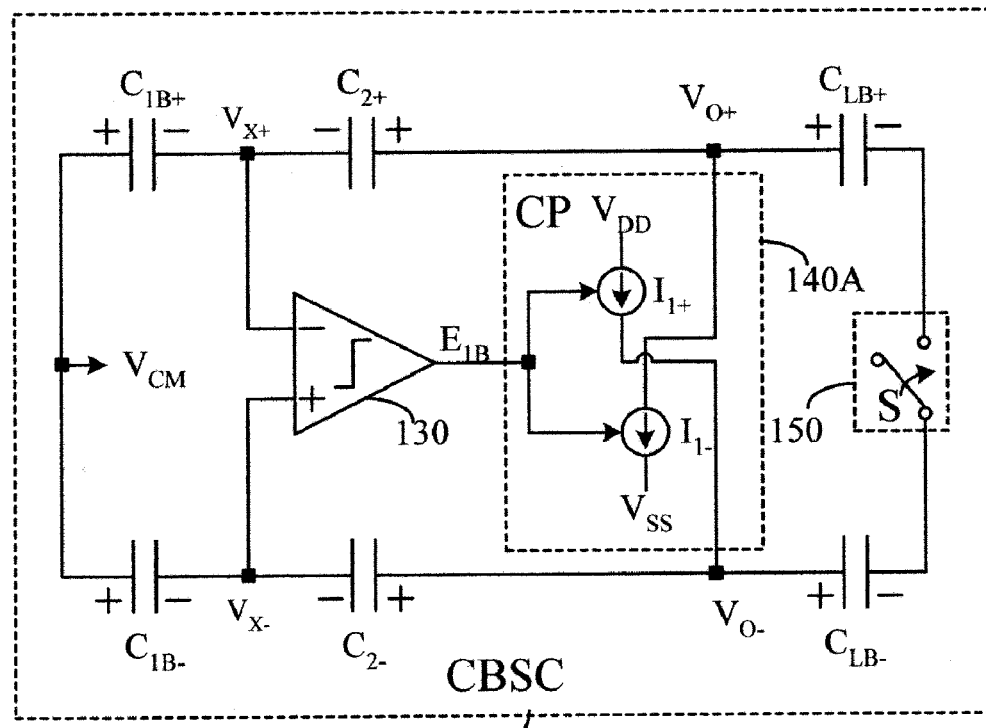
FIG. 9 depicts an alternative differential circuit embodiment during a second transfer phase.

In an alternative embodiment, the circuit configuration of CBSC 100E during the second transfer phase is depicted in FIG. 9, which is exactly the same as CBSC 100C depicted in FIG. 7 except for the following changes: (1) comparator 130 is connected in a reverse polarity, (2) charge pump CP 140A is connected in a reverse polarity, and (3) $E_{1A}$ is replaced by $E_{1B}$. Similarly, the second transfer phase comprises three sub-phases: preset ($P_B$), coarse charge transfer ($E_{1B}$) and hold ($H_B$). During preset ($P_B$), $V_{O+}$ is pulled to $V_{DD}$ and $V_{O-}$ is pulled to $V_{SS}$, forcing $V_{X+} > V_{X-}$. During coarse charge transfer ($E_{1B}$), $V_{X+} > V_{X-}$ and CP 140A injects charge into $V_{O-}$ and drains charge from $V_{O+}$ until comparator 130 detects $V_{X+} < V_{X-}$. Then it enters hold ($H_B$) phase, where switch 150 is turned off and CP 140A is disabled.

Throughout this disclosure, there are many switches (besides switch 150) that are needed but not displayed in any of the figures. They are controlled by a plurality of clock signals to define the circuit configuration (i.e. the connections among circuit elements) for both sampling phase ($\phi_1$) and the transfer phase ($\phi_{2A}$, $\phi_{2B}$). They are not shown in the figures because they are implied and deemed obvious to those of ordinary skill in the art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A comparator based switch capacitor (CBSC) circuit comprising the following circuit elements: a comparator, a charge pump, and a plurality of capacitors, wherein:

during a sampling phase the CBSC circuit samples an input voltage;

during a first transfer phase the CBSC circuit amplifies the sampled input voltage by a ratio and transfers a first resultant voltage to a first load; and during a second transfer phase the CBSC circuit reverses a polarity of connection for at least one of said circuit elements, amplifies the sampled input voltage by the ratio and transfers a second resultant voltage to a second load.

2. The CBSC circuit of claim 1, wherein the CBSC circuit operates cyclically through the sampling phase, the first transfer phase, and the second transfer phase.

3. The CBSC circuit of claim 1, wherein the first transfer phase comprises a first preset sub-phase, a first charge transfer sub-phase, and a first hold sub-phase.

4. The CBSC circuit of claim 3, wherein the second transfer phase comprises a second preset sub-phase, a second charge transfer sub-phase, and a second hold sub-phase.

5. The CBSC circuit of claim 1, wherein said capacitors comprise a sampling capacitor and an integrating capacitor.

6. The CBSC circuit of claim 5, wherein the sampling capacitor is coupled to the input voltage during the sampling phase.

7. The CBSC circuit of claim 6, wherein the integrating capacitor is coupled to the charge pump during the first transfer phase, and also coupled to the charge pump during the second transfer phase but in a reverse polarity.

8. The CBSC circuit of claim 1, wherein the first load comprises a capacitor.

9. A method of averaging out the error due to circuit non-idealities for a comparator based switch capacitor (CBSC) circuit comprising the following circuit elements: a comparator, a charge pump circuit, and a plurality of capacitors, the method comprising:
sampling an input voltage during a sampling phase;
amplifying the sampled input voltage by a ratio and transferring a first resultant voltage to a first load during a first transfer phase;
reversing a polarity of connection for one of said circuit elements; and
amplifying the sampled input voltage by the ratio and transferring a second resultant voltage to a second load during a second transfer phase.

10. The method of claim 9, further comprising:
combining outputs taken at the first load and at the second load.

11. The method of claim 10, wherein the capacitors comprise a sampling capacitor and an integrating capacitor.

12. The method of claim 11, wherein the integrating capacitor is coupled to the charge pump during the first transfer phase, and also coupled to the charge pump during the second transfer phase but in a reverse polarity.

13. The method of claim 10, further comprising:
operating the CBSC circuit cyclically through the sampling phase, the first transfer phase, and the second transfer phase.

14. The method of claim 13, wherein the capacitors comprise a sampling capacitor and an integrating capacitor.

15. The method of claim 14, wherein the integrating capacitor is coupled to the charge pump during the first transfer phase, and also coupled to the charge pump during the second transfer phase but in a reverse polarity.

16. The method of claim 9, wherein the first transfer phase comprises a first preset sub-phase, a first charge transfer sub-phase, and a first hold sub-phase.

17. The method of claim 9, wherein the capacitors comprise a sampling capacitor and an integrating capacitor.

18. The method of claim 17, wherein the sampling capacitor is coupled to the input voltage during the sampling phase.

19. The method of claim 17, wherein the integrating capacitor is coupled to the charge pump during the first transfer phase, and also coupled to the charge pump during the second transfer phase but in a reverse polarity.

20. The method of claim 9, further comprising:
operating the CBSC circuit cyclically through the sampling phase, the first transfer phase, and the second transfer phase.

* * * * *